(12) United States Patent
Nimmer et al.

(10) Patent No.: US 6,980,182 B1
(45) Date of Patent: Dec. 27, 2005

(54) DISPLAY SYSTEM

(75) Inventors: Mark J. Nimmer, Marion, IA (US); Ronald A. Ferrante, Cedar Rapids, IA (US); Goulin Peng, Cedar Rapids, IA (US); Martin J. Steffensmeier, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 104 days.

(21) Appl. No.: 10/691,228

(22) Filed: Oct. 22, 2003

(51) Int. Cl.[7] .............................................. G09G 3/32
(52) U.S. Cl. ....................................... 345/82; 345/204
(58) Field of Search .............................. 345/82, 83, 87, 345/98, 103, 204; 315/169.1, 169

(56) References Cited

U.S. PATENT DOCUMENTS

| | | | |
|---|---|---|---|
| 4,602,292 A * | 7/1986 | Togashi et al. .............. | 348/792 |
| 5,049,865 A * | 9/1991 | Nakamura et al. ............ | 345/60 |
| 5,206,634 A * | 4/1993 | Matsumoto et al. .......... | 345/99 |
| 5,392,058 A * | 2/1995 | Tagawa ....................... | 345/104 |
| 5,982,345 A * | 11/1999 | Takayama et al. ............ | 345/76 |
| 2003/0122748 A1 * | 7/2003 | Ho .............................. | 345/82 |
| 2003/0122751 A1 * | 7/2003 | Chen et al. ................... | 345/82 |
| 2005/0052141 A1 * | 3/2005 | Thielemans et al. ..... | 315/169.3 |

* cited by examiner

*Primary Examiner*—Xiao Wu
(74) *Attorney, Agent, or Firm*—Nathan O. Jensen; Kyle Eppele

(57) ABSTRACT

A passive matrix organic light emitting display system includes a plurality of pixels configured for emitting light when energized by one of a plurality of row electrodes and one of a plurality of column electrodes. The display system also comprises a plurality of column drivers configured for energizing the plurality of column electrodes. The display system also comprises a plurality of row drivers configured for energizing the plurality of row electrodes. At least two of the plurality of row drivers are configured to simultaneously energize at least two of the plurality of row of electrodes. A method of displaying information on a passive matrix organic light emitting display system is also disclosed.

21 Claims, 5 Drawing Sheets

DISPLAY SYSTEM

FIELD

The present invention relates to a display system. More particularly, the present invention relates to a passive matrix organic light emitting diode display.

BACKGROUND OF THE INVENTION

It is generally known to provide conventional organic light-emitting diodes (OLED). OLEDs are multilayer, organic, thin film devices fabricated by vacuum evaporation techniques, with resulting current voltage characteristics similar to semiconductor diodes. Displays based on OLEDs may be used in a variety of applications such as car radios, mobile phones, digital cameras, camcorders, personal digital assistants, games, notebook personal computers, etc.

Conventional OLED displays typically include an array of picture elements or pixels deposited on a patterned substrate in a matrix of row electrodes and column electrodes. Each pixel comprises an OLED formed at the intersection of each row electrode and column electrode.

Conventional passive matrix OLED displays have a structure that is well-suited for low-cost and low-information content applications such as alphanumeric displays. To drive such known passive matrix OLED displays, electrical current is passed through selected pixels by applying a voltage to the corresponding row electrodes and column electrodes. The voltage is applied by drivers attached to each row electrode and column electrode. The resulting two-dimensional series of lights (i.e. information) is viewed on a display or panel.

An external controller circuit typically provides the necessary input power, video data signal and multiplex switches of such conventional passive matrix OLED displays. The data signal is generally supplied to the column electrodes and synchronized to the scanning of the row electrodes. When a particular row is selected, the column electrodes and the row electrodes determine which pixels are lighted. A video output is thus displayed on the panel by scanning through all the rows of electrodes successively in a "duty cycle" or frame time, typically refreshing or scanning in about $\frac{1}{60}$ second but as fast as about $\frac{1}{120}$ second. However, this has several disadvantages including that the row drivers of such conventional passive matrix OLED displays can only drive a relatively small array of pixels (i.e. the voltage may be applied only to a single row per scan), so a minimum duty cycle is required to produce sufficient light.

Other conventional passive matrix OLED displays have two row drivers and a second set of column drivers (i.e. on opposite sides or edges of the display). Effectively such conventional passive matrix OLED displays comprise two displays that are physically close together. However, such conventional passive matrix OLED displays have several disadvantages, including that the number of horizontal pixels is limited by the capacity of the two row drivers.

Accordingly, there is a need for a passive matrix organic light emitting diode display system that energizes multiple rows of electrodes at the same time (e.g. per duty cycle). There is also a need for an OLED display that is thin and lightweight. Yet further, there is a need for a display system having one or more of these or other advantageous features.

SUMMARY OF THE INVENTION

One embodiment relates to a passive matrix organic light emitting diode display system. The display system comprises a plurality of pixels configured for emitting light when energized by one of a plurality of row electrodes and one of a plurality of column electrodes. The display system also comprises a plurality of column drivers configured for energizing the plurality of column electrodes. The display system also comprises a plurality of row drivers configured for energizing the plurality of row electrodes. At least two of the plurality of row drivers are configured to simultaneously energize at least two of the plurality of row electrodes.

Yet another exemplary embodiment relates to a method of displaying information on a passive matrix organic light emitting diode display system. The display system comprises a first column driver having a first column electrode, a second column driver having a second column electrode, a first row driver having a first row electrode, a second row driver having a second row electrode, and a first pixel and a second pixel. The method comprises energizing the first column driver thereby energizing the first column electrode and energizing the second column driver thereby energizing the second column electrode. The method also comprises energizing the first row driver thereby energizing the first row electrode and energizing the second row driver thereby energizing the second row electrode. The method also comprises subsequently energizing the first pixel at the intersection of the first row electrode and the first column electrode and energizing the second pixel at the intersection of the second row electrode and the second column electrode. The first row driver is energized simultaneously with the second row driver.

Still another exemplary embodiment relates to a passive matrix organic light emitting diode display system. The display system comprises means for emitting light. The display system also comprises a plurality of row electrodes and a plurality of column electrodes. The display system also comprises means for energizing the plurality of column electrodes. The display system also comprises first means for energizing a first row electrode of the plurality of row electrodes. The display system also comprises second means for energizing a second row electrode of the plurality of row electrodes. The first means for energizing the first row electrode and the second means for energizing the second row electrode are configured to simultaneously energize the first row electrode and the second row electrode.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EXEMPLARY EMBODIMENTS

Figure 1:
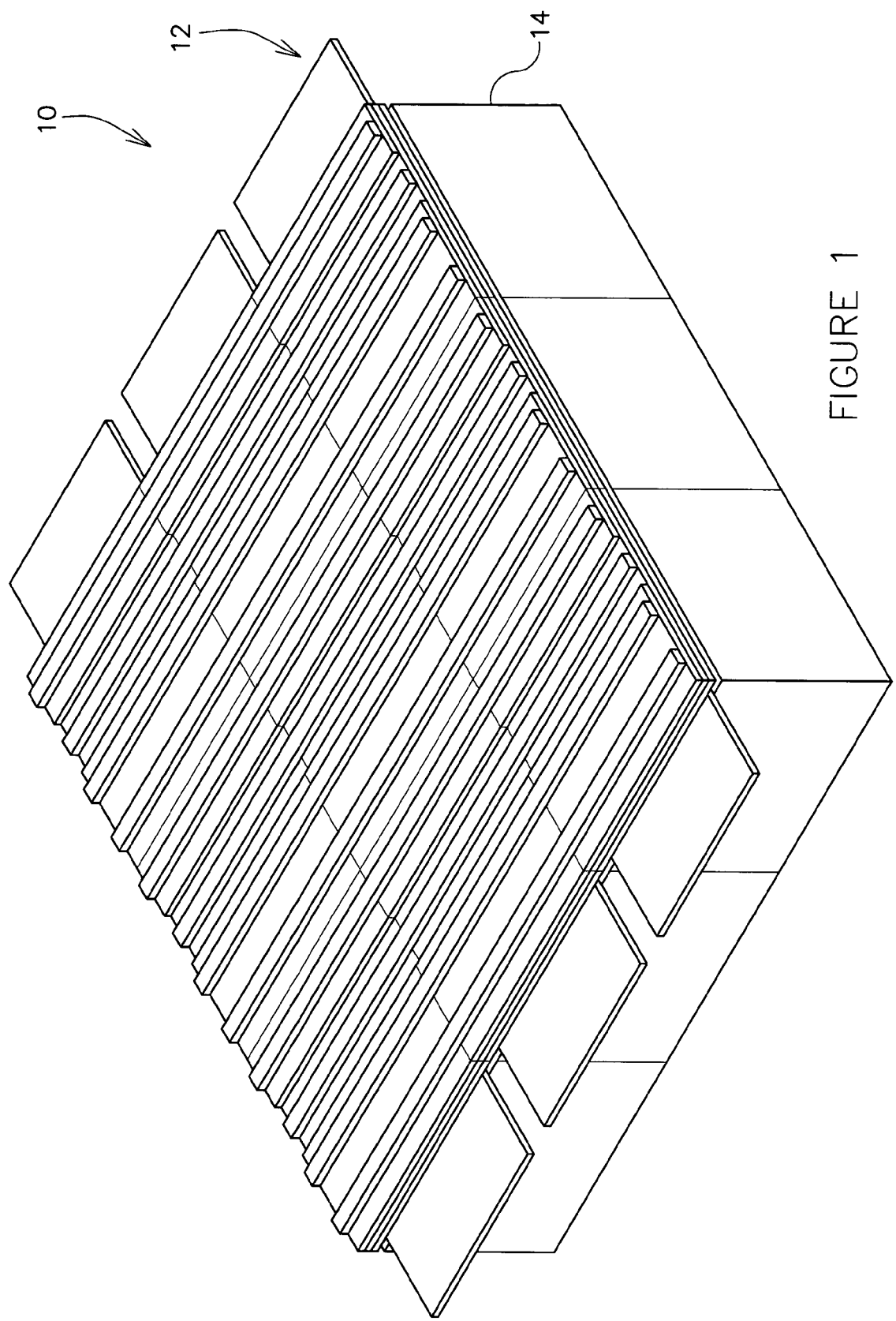
FIG. 1 is a perspective view of a display system according to an exemplary embodiment of the present invention.

Referring to FIG. 1, a passive matrix organic light emitting diode (OLED) panel is shown as a display system 10 according to an exemplary embodiment. The display system has a relatively high resolution (compare active matrix OLED displays and liquid crystal displays). This high resolution is achieved by providing a plurality of row drivers each associated with one or more independent, corresponding column drivers (see e.g. FIG. 5).

Figure 2:
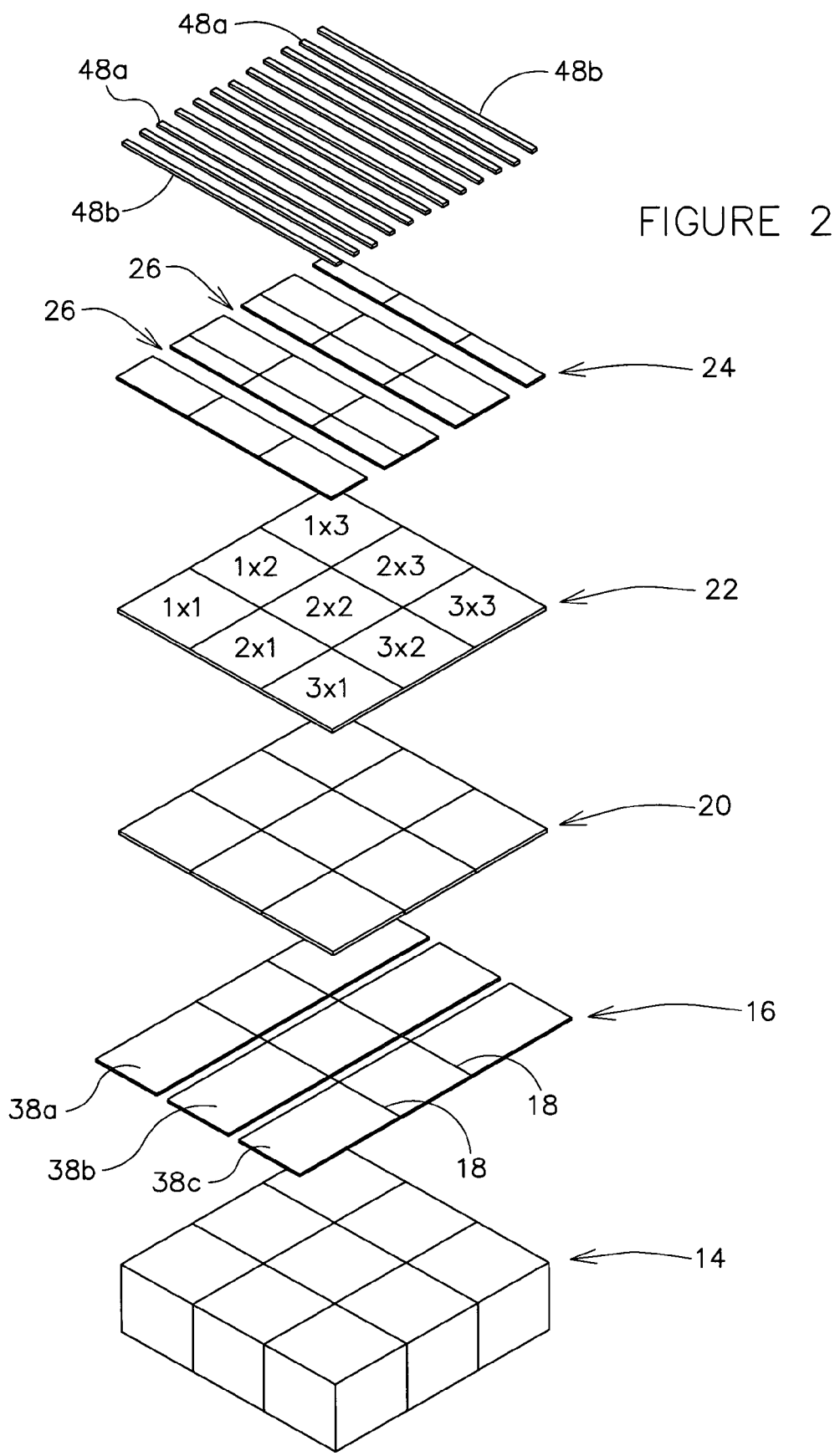
FIG. 2 is an exploded perspective view of the display system of FIG. 1.

As shown in FIG. 1, display system 10 includes a number of sheets or layers 12 built on a substrate (shown as a plastic or glass layer 14). The glass layer has a thickness of about 1 to 5 millimeters according to a particularly preferred embodiment. Referring to FIG. 2, layers 12 are shown built on glass layer 14 (e.g. by a photolithographic method). First, a conductive layer 16 having row electrodes 38a through 38c is deposited on glass layer 14. A partition structure shown as a rib 18 is then placed on row electrodes 38a through 38c to provide individual pixels (shown as pixels 1×1 through 3×3 in FIG. 2). The pixels are referred to in this disclosure by their row number and column number. The pixels are at least about 100 um wide according to a preferred embodiment. The width of the pixels may be less than about 100 um by several orders of magnitude according to alternative embodiments.

Referring further to FIG. 2, an OLED organic stack or layers 20 (e.g. comprising about 2 to 7 layers) is next deposited on conductive layer 16. Thereafter, a pixel face or transparent, conductive overcoat layer 22 including a conductive material such as indium tin oxide (ITO) is deposited on organic layer 20.

Referring further to FIG. 2, a transparent mask layer 24 of a dielectric or nonconductive material such as titanium dioxide is deposited on overcoat layer 22. Finally, column lines (shown in FIG. 2 as a column electrode 48a and a column electrode 48b) are deposited on pixel face 22 and/or mask layer 24. According to a preferred embodiment as shown in FIG. 1, multiple column lines are provided (e.g. etched) across the face of a single pixel (e.g. at least about 32 column lines per pixel element, at least about 16 column lines per pixel element, preferably at least about 8 column lines per pixel element, preferably at least about 4 column lines per pixel element, preferably at least about 1 column line per pixel element, according to alternative embodiments).

Figure 3:
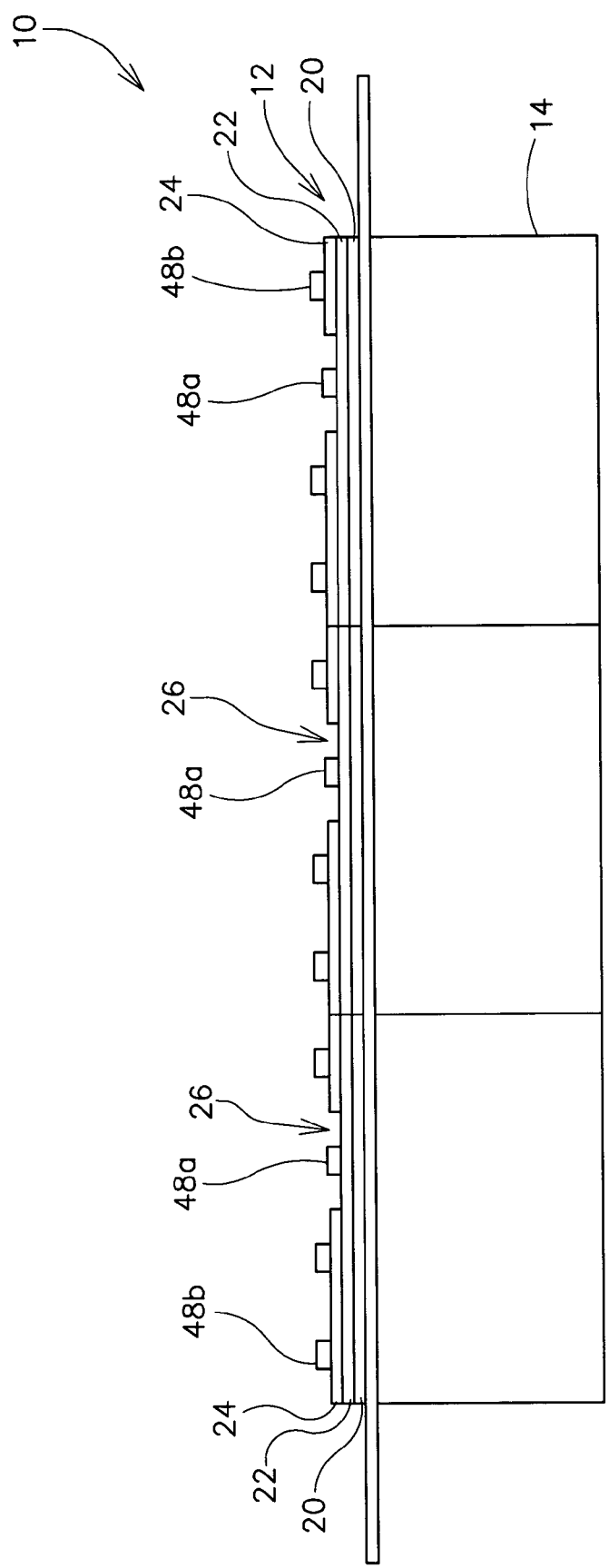
FIG. 3 is a side elevation view of the display system of FIG. 1.

Mask layer 24 is intended to electrically separate column electrode 48b from the organic material of pixel face 22 according to a preferred embodiment as shown in FIG. 2. Mask layer 24 is separated by interposed gaps or spaces 26 which allow for electrical contact between column electrode 48a and pixel face 22 according to a preferred embodiment as shown in FIG. 2. See FIG. 3 showing column electrode 48a in electrical contact with pixel face 22 and column electrode 48b separated from electrical contact with pixel face 22 by mask layer 24. According to any preferred or alternative embodiment, one section or length of the column electrode may be in electrical contact with a pixel and another length of the column electrode may be "masked" or electrically isolated from the same pixel.

The mask layer is deposited with ion assisted deposition according to a preferred embodiment. Other insulating materials could be used according to alternative embodiments. According to a preferred embodiment, the index of refraction of the conductive overcoat layer, the mask layer, the conductive layer and/or the other layers of the stack are similar.

According to an alternative embodiment, a layer of a transparent electrode material (e.g. indium tin oxide or ITO) may be deposited on the pixel face before the mask layer is deposited to enhance the uniformity of the individual pixels. Such uniformity of the individual pixels assists in spreading out the electrical current across the entire pixel and avoids a hot spot where the pixel contacts the specific column line. (See e.g. FIG. 3 showing the interface between column electrode 48a in electrical contact with pixel face 22). According to another alternative embodiment, a final insulating layer could be over-coated on the thin column lines for physical and/or electrical protection. According to another alternative embodiment, the "stack" or OLED display may be also be built "upside down" with the multiplex column lines built first and the organic material and row lines subsequently formed on top.

Figure 4:
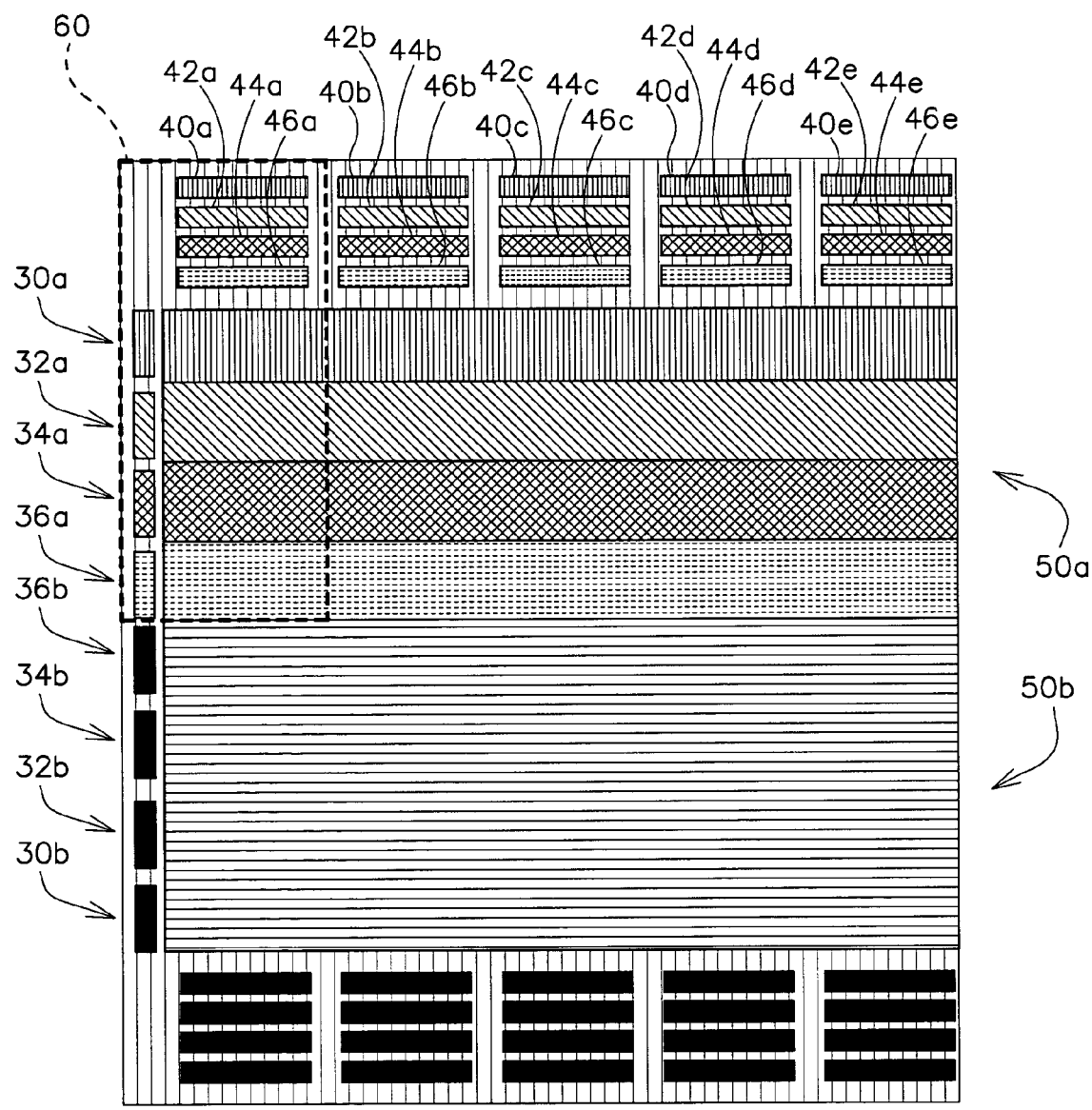
FIG. 4 is a top plan view of a display system according to an alternative embodiment.

Referring to FIG. 4, display system 10 is shown according to an alternative embodiment. As shown in FIG. 4, display system 10 includes an upper display panel 50a and a lower display panel 50b. Upper display panel 50a includes an array of upper row drivers shown as upper row drivers 30a, 32a, 34a and 36a. Upper display panel 50a also includes an array of upper column drivers. The upper column drivers in region 60 are shown as upper column drivers 40a, 42a, 44a and 46a. According to an alternative embodiment, display system 10 may include any number of additional upper column drivers shown in FIG. 4 as upper column drivers 40b–40e, 42b–42e, 44b–44e and 46b–46e.

Figure 5:
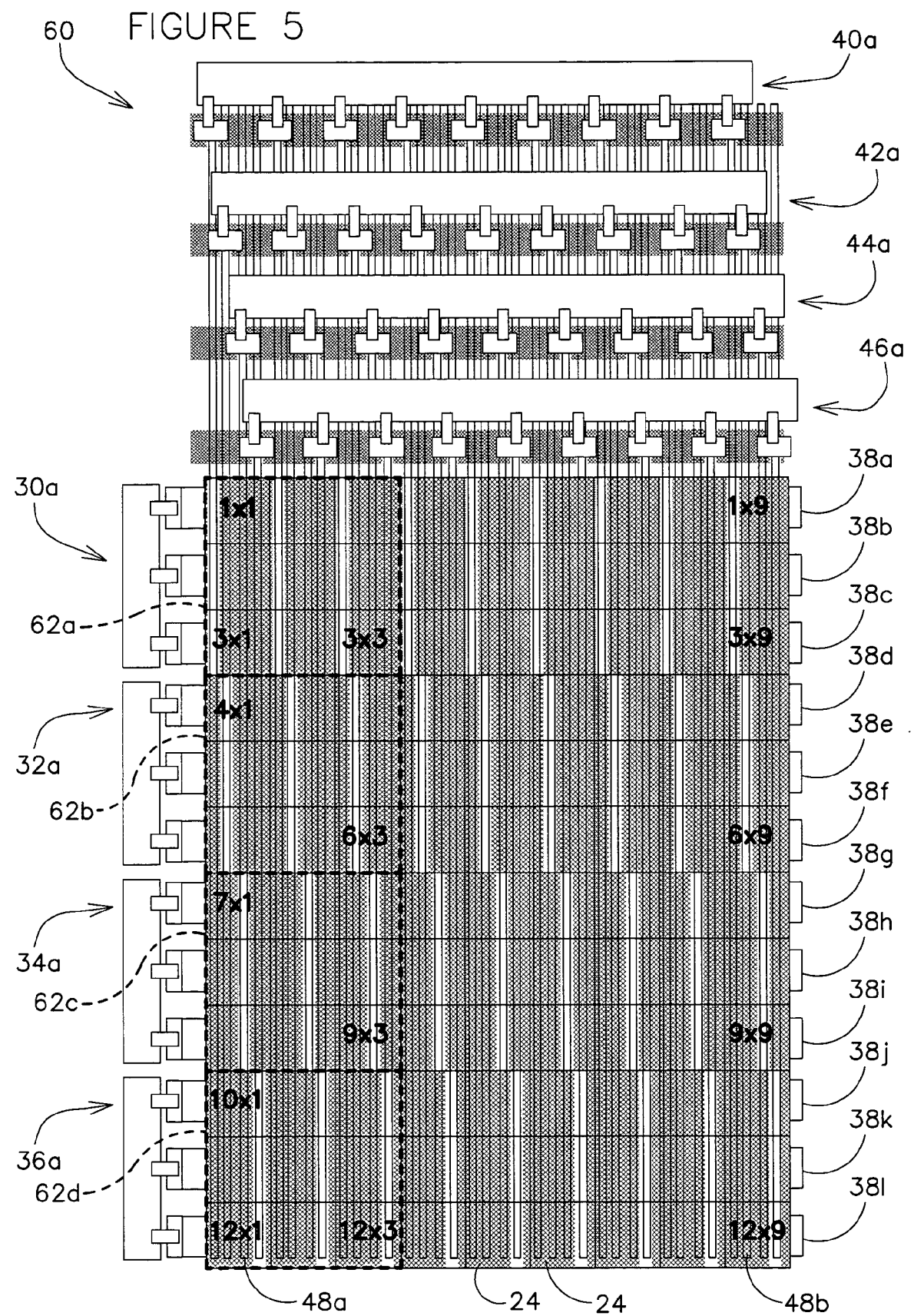
FIG. 5 is a top plan view of a 12×9 pixel section of the display system of FIG. 4.

As shown schematically in FIG. 5 according to a preferred embodiment, upper column driver 40a cooperates only with upper row driver 30a to light pixels 1×1 through 3×3 associated with row electrodes 38a, 38b and 38c at the intersection of column electrode 48a associated with upper column driver 40a and row electrodes 38a, 38b and 38c associated with row driver 30a. Likewise, upper column drivers 42a, 44a and 46a are independently, electrically connected to upper row drivers 32a, 34a and 36a (respectively) according to a preferred embodiment as shown in FIG. 5.

Referring further to FIG. 4, lower display panel 50b is shown having a similar structure and arrangement to that of upper display panel 50a. Upper display panel 50a and lower display panel 50b are not necessarily electrically connected. Rather, upper display panel 50a and lower display panel 50b effectively comprise two displays that are physically close together according to a preferred embodiment as shown in FIG. 4. Lower display panel 50b includes an array of lower row drivers 30b through 36b (similar in structure and function to upper row drivers 30a through 36a). Lower display panel 50b also includes an array of lower column drivers (similar in structure and function to upper column drivers 40a through 46e).

Referring to FIG. 5, region 60 of display system 10 is shown. Region 60 includes an array of 12×9 pixels. As shown in FIG. 5, to light pixels 1×1 through 3×3 in a region 62a, upper column driver 40a energizes the column electrodes associated with upper column driver 40a and upper row driver 30a energizes row electrodes 38a through 38c. As shown in FIG. 5 according to a preferred embodiment, column electrodes 48a associated with upper column driver 40a are electrically connected only to the pixels 1×1 through 3×3 associated with row electrodes 38a, 38b and 38c. Mask layer 24 prevents electrical contact between column electrodes 48b associated with upper column driver 40a and row electrodes 38d through 38l associated with upper row drivers 32a through 36a. To light pixel 1×1, for example, upper column driver 40a energizes its associated column electrodes. Since mask layer 24 partitions row electrodes 38d through 38l associated with upper row drivers 32a through 36a from the column electrodes associated with upper column driver 40a, pixels 4×1 through 12×9 are not lighted. When upper row driver 30a energizes row electrode 38a, pixel 1×1 is thereby lighted. The pixels in row 30a outside of region 60 are lighted by the energization of one or more of column drivers 40b–40e, 42b–42e, 44b–44e and/or 46b–46e according to an alternative embodiment as shown in FIG. 4.

Referring further to FIG. 5, a region 62b of display system 10 is shown. Region 62b includes pixels 4×1 through 6×3. As shown in FIG. 5, to light pixels 4×1 through 6×3, upper column driver 42a energizes the column electrodes associated with upper column driver 42a and upper row driver 32a energizes row electrodes 38d, 38e and 38f. As shown in FIG. 5 according to a preferred embodiment, the column electrodes associated with upper column driver 42a are electrically connected only to row electrodes 38d, 38e and 38f. Mask layer 24 prevents electrical contact between the column electrodes associated with upper column driver 42a and row electrodes 38d, 38e and 38f associated with upper row driver 32a. Other pixels in row 32a (e.g. pixels 2×10 through 2×42 shown in FIG. 4) may be lighted by the energization of one or more of column drivers 40b through 46e.

Since upper column driver 40a is independently associated with only upper row driver 30a (see region 62a) and upper column driver 42a is associated with only upper row driver 32a (see region 62b), any and/or all pixels in region 62a and region 62b may be lighted simultaneously (e.g. during the same scan) according to a preferred embodiment as shown in FIG. 5. Referring further to FIG. 5, upper column driver 40a cooperates only with upper row driver 30a to light pixels 1×1 through 3×9 at the intersection of the column electrodes associated with upper column driver 40a and row electrodes 38a, 38b and 38c associated with upper row driver 30a. Likewise, upper column drivers 42a, 44a and 46a are independently, electrically connected only to upper row drivers 32a, 34a and 36a (respectively) to light pixels 4×1 through 6×9, 7×1 through 9×9 and 10×1 through 12×9 (respectively) according to a preferred embodiment as shown in FIG. 5. Thus, multiple row drivers may be "multiplexed" or activated during a single duty cycle or refreshing period of the display and any or all of the pixels in region 60 may be lighted simultaneously (see FIG. 5).

It is understood that while the detailed descriptions, specific examples, material types, thicknesses, dimensions, and shapes discussed provide preferred exemplary embodiments of the present invention, the preferred exemplary embodiments are for the purpose of illustration only. For example, according to an alternative embodiment, the OLED display may have at least about 960 row electrodes and at least about 960 column electrodes. According to other alternative embodiments, the OLED display may have a duty cycle of up to about 1/200 second. The method and the system of the present invention are not limited to the precise details and conditions disclosed. Various changes may be made to the details disclosed without departing from the scope of the invention, which is defined by the following claims.

What is claimed is:

1. A passive matrix organic light emitting diode display system comprising:

a plurality of pixels disposed on a single substrate configured for emitting light when energized by one of a plurality of row electrodes and one of a plurality of column electrodes;

a plurality of column drivers configured for energizing the plurality of column electrodes;

a plurality of row drivers configured for configured for energizing the plurality of row electrodes;

wherein at least two of the plurality of row drivers are configured to simultaneously energize at least two of the plurality of row of electrodes, wherein the two row drivers include a first row driver and a second row driver, wherein the column driver includes a first set of column drivers and a second set of column drivers, wherein the first set of column drivers do not energize pixels energized by the second row driver and energize pixels energized by the first row driver.

2. The display system of claim 1 wherein at least three of the plurality of row drivers are configured to simultaneously energize at least three of the plurality of row electrodes.

3. The display system of claim 1 wherein at least two of the plurality of row drives are configured to be activated at the same time.

4. The display system of claim 1 wherein at least two of the plurality of row drivers are active per duty cycle of the display system.

5. The display system of claim 1 wherein at least two of the plurality of row drivers are multiplexed.

6. The display system of claim 3 wherein the at least two row divers are on the same side of the display.

7. The display system of claim 6 wherein each of the plurality of pixels include at least four of the plurality of column electrodes.

8. The display system of claim 7 wherein each of the plurality of pixels include at least eight of the plurality of column electrodes.

9. The display system of claim 8 wherein each of the plurality of column electrodes are in electrical contact with only one of the plurality of pixels.

10. A method of displaying information on a passive matrix organic light emitting diode display system comprising a first column driver having a first column electrode, a second column driver having a second column electrode, a first row driver having a first row electrode, a second row driver having a second row electrode, a first pixel and a second pixel, the first and second pixel being disposed on a single substrate, the method comprising:

energizing the first column driver thereby energizing the first column electrode and energizing the second column driver thereby energizing the second column electrode;

energizing the first row driver thereby energizing the first row electrode and energizing the second row driver thereby energizing the second row electrode to energize the first pixel at the intersection of the first row electrode and the first column electrode and to energize the second pixel at the intersection of the second row electrode and the second column electrode, wherein the second column electrode is electrically isolated from the first pixel and is electrically coupled to the second pixel;

wherein the first row driver is energized simultaneously with the second row driver.

11. The method of claim 10 wherein energizing the first row driver and the second row driver comprises energizing the first row driver and the second row driver on the same side of the display system.

12. The method of claim 11 wherein energizing the first column driver and the second column driver comprises energizing the first column driver and the second column driver on the same side of the display system.

13. A passive matrix organic light emitting diode display system comprising:
- means for emitting light;
- a plurality of row electrodes and a plurality of column electrodes;
- means for energizing the plurality of column electrodes;
- first means for energizing a first row electrode of the plurality of row electrodes;
- second means for energizing a second row electrode of the plurality of row electrodes;
- wherein the first means for energizing the first row electrode and the second means for energizing the second row electrode are configured to simultaneously energize the first row electrode and the second row electrode, wherein pixels associated with the first row electrode do not share the column electrodes with pixels associated with the second row electrode.

14. The display system of claim 13 wherein the means for emitting light comprises a plurality of pixels.

15. The display system of claim 14 wherein the means for energizing the plurality of column electrodes comprises a column driver.

16. The display system of claim 15 wherein the first means for energizing the first row electrode comprises a first column driver.

17. The display system of claim 16 wherein the second means for energizing the second row electrode comprises a second column driver.

18. The display system of claim 17 wherein the first row drive and the second row driver are active during the same cycle of the display system.

19. The display system of claim 18 wherein the first row driver and the second row driver are on the same side of the display.

20. The display system of claim 19 wherein each of the plurality of pixels include at least four of the plurality of column electrodes.

21. The display system of claim 20 wherein each of the plurality of pixels include at least eight of the plurality of column electrodes.

* * * * *